(12) United States Patent
Fukui et al.

(10) Patent No.: US 7,615,118 B2
(45) Date of Patent: Nov. 10, 2009

(54) SUBSTRATE PROCESSING APPARATUS AND SUBSTRATE PROCESSING METHOD

(75) Inventors: Katsuhiro Fukui, Kyoto (JP); Toshio Hiroe, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 357 days.

(21) Appl. No.: 11/464,658

(22) Filed: Aug. 15, 2006

(65) Prior Publication Data

US 2007/0072436 A1 Mar. 29, 2007

(30) Foreign Application Priority Data

Sep. 28, 2005 (JP) ............................. 2005-282115

(51) Int. Cl.
*B05C 3/12* (2006.01)

(52) U.S. Cl. ...................................... 118/423; 118/733

(58) Field of Classification Search ................ 118/731, 118/423, 428, 733; 414/939, 217; 901/31
See application file for complete search history.

(56) References Cited

U.S. PATENT DOCUMENTS

| 6,158,449 A | 12/2000 | Kamikawa |
| 6,164,297 A | 12/2000 | Kamikawa |

FOREIGN PATENT DOCUMENTS

| JP | 11-186212 | 7/1999 |
| JP | 11-192459 | 7/1999 |
| JP | 3156075 | 2/2001 |

*Primary Examiner*—Brenda A Lamb
(74) *Attorney, Agent, or Firm*—Ostrolenk Faber LLP

(57) ABSTRACT

In a substrate processing apparatus of the present invention, when substrates are loaded into a chamber, a frame part formed integral with a substrate holding part is interposed between the chamber and a cover, thereby sealing the interior of the chamber. When the substrates are unloaded to above the chamber, the chamber and the cover are brought into a direct contact, thereby sealing the interior of the chamber. Hence, the interior of the chamber can be sealed satisfactorily when the substrates are loaded into the chamber, and when the substrates are unloaded to above the chamber.

9 Claims, 16 Drawing Sheets

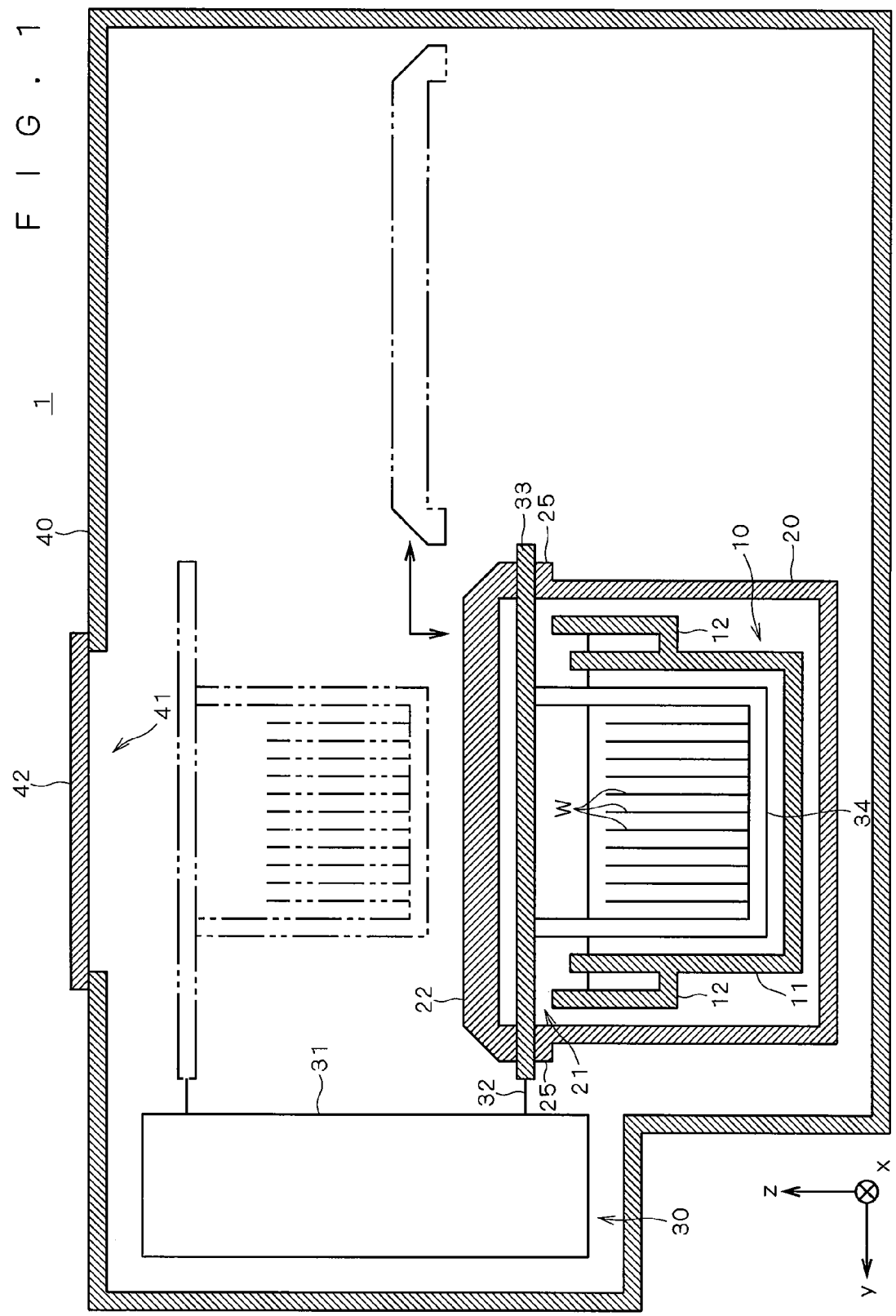
F I G . 1

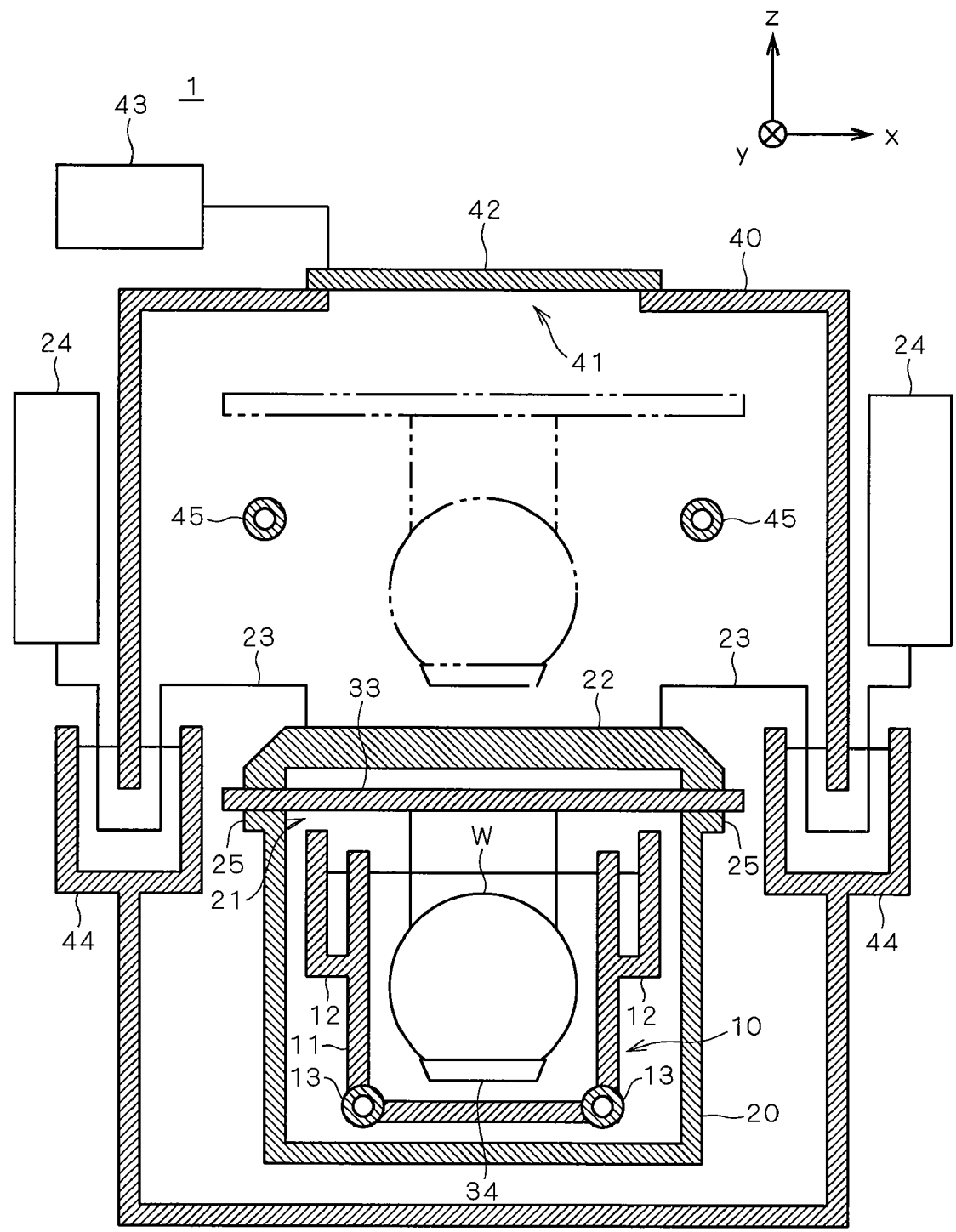
F I G . 2

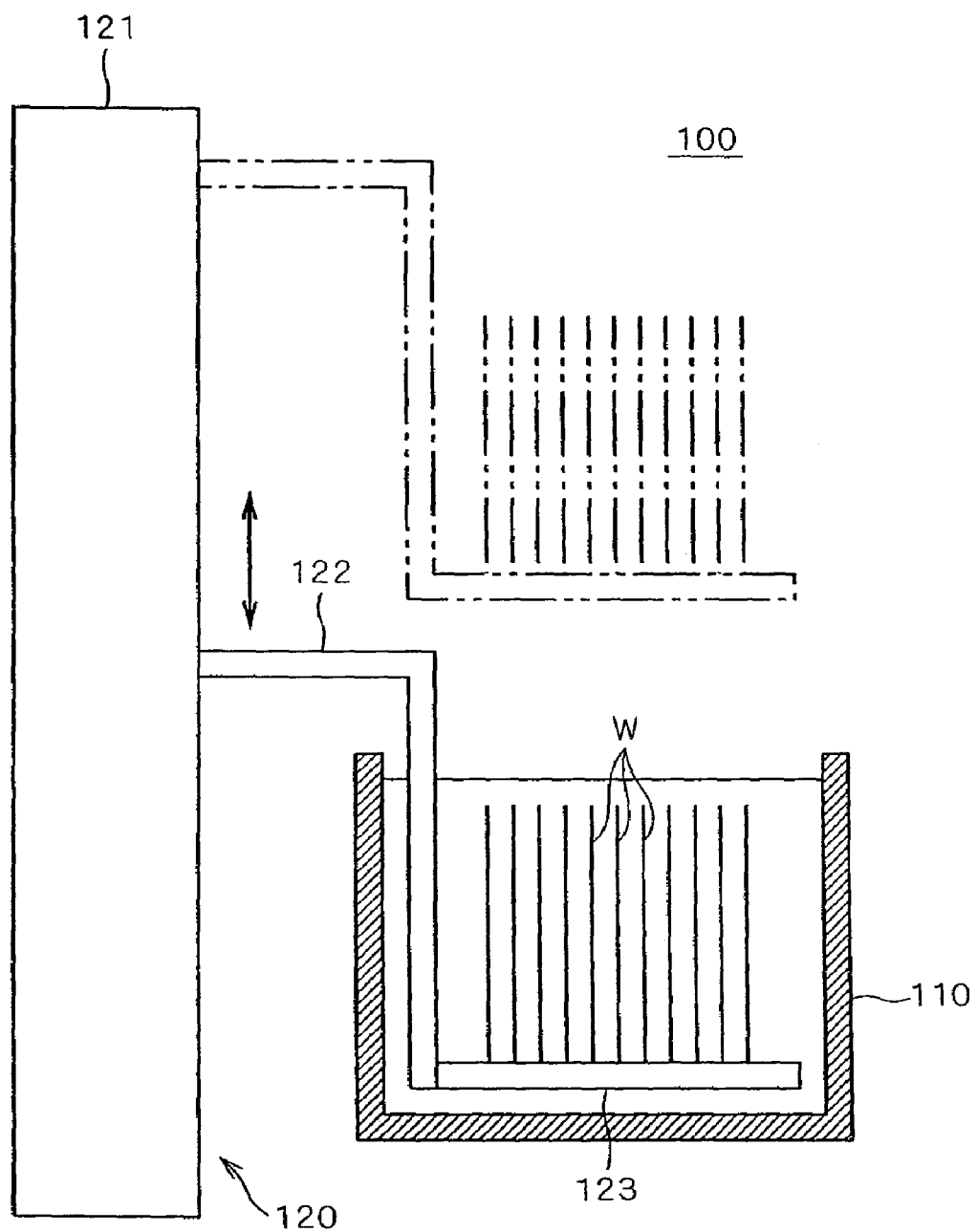
FIG. 21 - PRIOR ART -

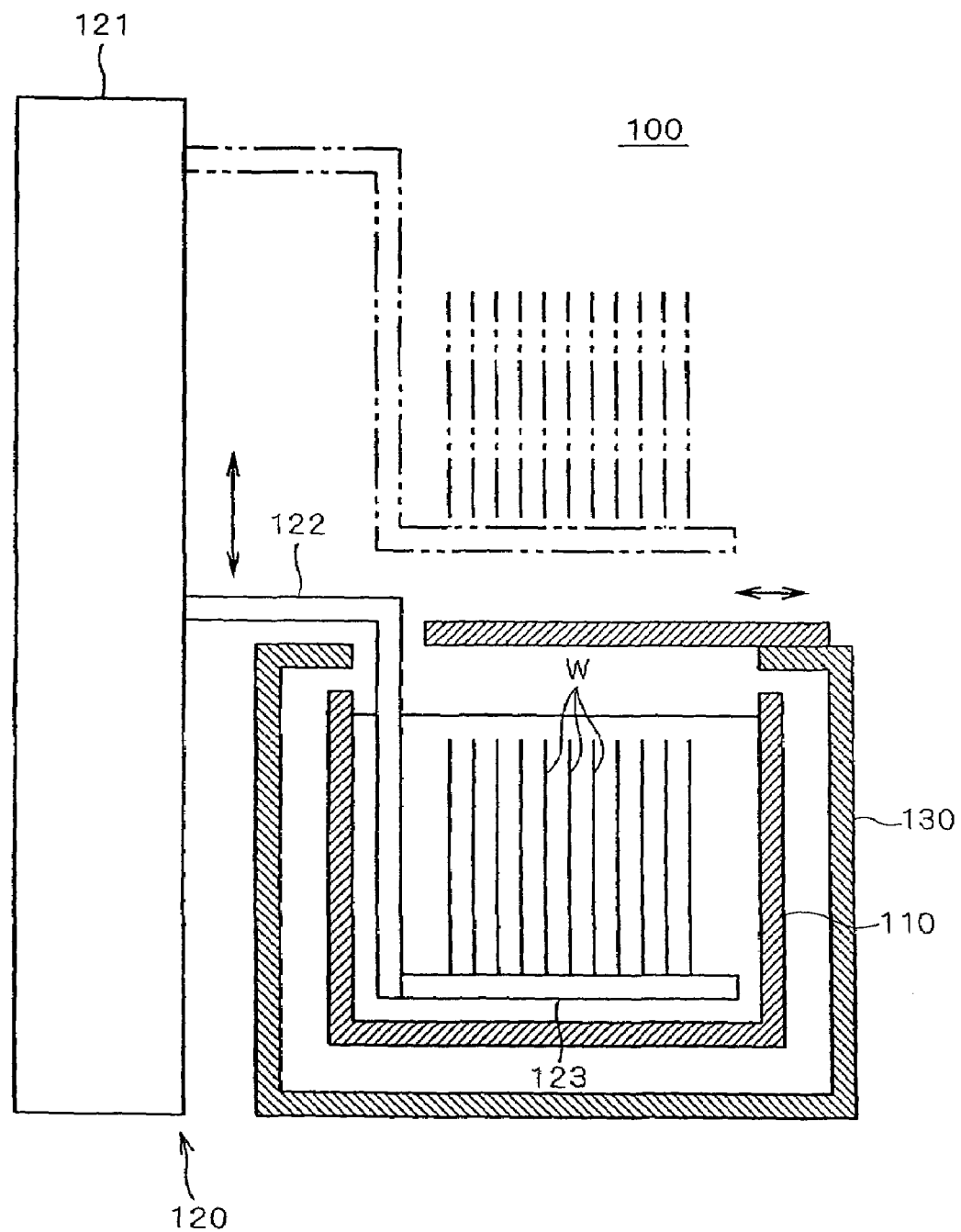
F I G . 2 2   - PRIOR ART -

SUBSTRATE PROCESSING APPARATUS AND SUBSTRATE PROCESSING METHOD

BACKGROUND OF THE INVENTION

1. Field of the Invention

The present invention relates to a substrate processing apparatus that performs a predetermined process of substrates such as semiconductor substrates, glass substrates for liquid crystal display devices, and glass substrates for photomasks, and to a substrate processing method.

2. Description of the Background Art

Conventionally, known in the manufacturing steps of substrates is a substrate processing apparatus that performs a predetermined process of substrates by immersing the substrates in a processing solution. FIG. 21 is a diagram illustrating a conventional substrate processing apparatus. A substrate processing apparatus 100 as shown in FIG. 21 is provided with a processing bath 110 that stores a processing solution, and a transporting mechanism 120 that transports substrates W up and down. The transporting mechanism 120 has a driving part 121, an arm part 122, and a substrate holding part 123. The driving part 121 is operated so that the arm part 122 and the substrate holding part 123 are integrally moved up and down. The substrates W are held on the substrate holding part 123, and transported up and down along with the substrate holding part 123.

When performing a predetermined process of the substrates W, the substrate processing apparatus 100 causes the driving part 121 to operate so that the arm part 122 and the substrate holding part 123 are integrally lowered. The substrate processing apparatus 100 performs the predetermined process of the substrates W by immersing the substrates W into a processing solution stored in the processing bath 110.

In the substrate processing apparatus 100 so constructed, it is desirable that a space including the processing bath 110 is sealed as narrow as possible, for the purpose of preventing diffusion of gas containing the compositions of the processing solution, and for the purpose of controlling the atmospheric pressure of a processing space. It is however difficult for the substrate processing apparatus 100 to seal the space including the processing bath 110 with no space around the arm part 122, because the substrates W are transported into the processing bath 110 along with the arm part 122.

For example, as shown in FIG. 22, if added a processing chamber 130 that is formed by an airtight member and encases the processing bath 110, it is difficult to arrange the processing chamber 130 with no space around the arm part 122.

SUMMARY OF THE INVENTION

The present invention is directed to a substrate processing apparatus that performs a predetermined process of a substrate.

According to one aspect of the present invention, a substrate processing apparatus includes: a) a processing chamber having on an inside thereof a processing space for performing a predetermined process of a substrate; b) a transporting part that transports a substrate between the inside of the processing chamber and an outside thereof, through an opening part formed at an upper part of the processing chamber, and c) a cover that opens and closes the opening part. The transporting part includes: b-1) a driving part disposed on the outside of the processing chamber; b-2) a holding part that holds a substrate and moves between the inside and the outside of the processing chamber by a drive of the driving part; and b-3) a frame part disposed between the driving part and the holding part. When the holding part is moved to the inside of the processing chamber, and the cover is closed, the frame part is interposed between a fringe portion of the opening part and the cover, thereby sealing an interior of the processing chamber. When the holding part is moved to the outside of the processing chamber, and the cover is closed, the cover contacts with the fringe portion of the opening part, thereby sealing the interior of the processing chamber.

The substrate processing apparatus enables the interior of the processing chamber to be sealed satisfactorily when the substrate is loaded into the processing chamber, and when the substrate is unloaded to the outside of the processing chamber.

Preferably, the fringe portion of the opening part is provided with an opening part side seal member. When the holding part is moved to the inside of the processing chamber, and the cover is closed, the opening part side seal member provides an airtight contact between the fringe portion of the opening part and the frame part. When the holding part is moved to the outside of the processing chamber, and the cover is closed, the opening part side seal member provides an airtight contact between the fringe portion of the opening part and the cover.

The substrate processing apparatus is capable of achieving a satisfactory airtight contact between the fringe portion of the opening part and the frame part, and between the fringe portion of the opening part and the cover.

Preferably, a cover side seal member is disposed at a lower part of the cover. When the holding part is moved to the inside of the processing chamber, and the cover is closed, the cover side seal member provides an airtight contact between the cover and the frame part. When the holding part is moved to the outside of the processing chamber, and the cover is closed, the cover side seal member provides an airtight contact between the fringe portion of the opening part and the cover.

The substrate processing apparatus is capable of achieving a satisfactory airtight contact between the cover and the frame part, and between the fringe portion of the opening part and the cover.

Preferably, the opening part side seal member and the cover side seal member are shifted to inside and outside, respectively.

This eliminates the possibility of any contact between the tip of the opening part side seal member and the tip of the cover side seal member, so that the substrate processing apparatus can seal the interior of the processing chamber more reliably.

Preferably, a processing bath that stores a processing solution is disposed on the inside of the processing chamber, and a substrate held by the holding part is immersed in the processing solution stored in the processing bath.

The substrate processing apparatus is capable of preventing diffusion of the atmosphere containing the compositions of the processing solution, while performing a predetermined process of the substrate with the processing solution.

According to other aspect of the present invention, a substrate processing apparatus includes: a) a processing bath that stores a processing solution; b) a transporting part that transports a substrate between an inside and an outside of the processing bath, through an opening part formed at an upper part of the processing bath; and c) a cover that opens and closes the opening part. The transporting part includes: b-1) a driving part disposed on the outside of the processing bath; b-2) a holding part that holds a substrate and moves between the inside and the outside of the processing bath by a drive of the driving part; and b-3) a frame part disposed between the driving part and the holding part. When the holding part is moved to the inside of the processing bath, and the cover is closed, the frame part is interposed between a fringe portion of the opening part and the cover, thereby sealing an interior of the processing bath. When the holding part is moved to the outside of the processing bath, and the cover is closed, the cover contacts with the fringe portion of the opening part, thereby sealing the interior of the processing bath.

The substrate processing apparatus enables the interior of the processing bath to be sealed satisfactorily when the substrate is loaded into the processing bath, and when the substrate is unloaded to the outside of the processing bath.

Preferably, the fringe portion of the opening part is provided with an opening part side seal member. When the holding part is moved to the inside of the processing bath, and the cover is closed, the opening part side seal member provides an airtight contact between the fringe portion of the opening part and the frame part. When the holding part is moved to the outside of the processing bath, and the cover is closed, the opening part side seal member provides an airtight contact between the fringe portion of the opening part and the cover.

The substrate processing apparatus is capable of achieving a satisfactory airtight contact between the fringe portion of the opening part and the frame part, and between the fringe portion of the opening part and the cover.

Preferably, a cover side seal member is disposed at a lower part of the cover. When the holding part is moved to the inside of the processing bath, and the cover is closed, the cover side seal member provides an airtight contact between the cover and the frame part. When the holding part is moved to the outside of the processing bath, and the cover is closed, the cover side seal member provides an airtight contact between the fringe portion of the opening part and the cover.

The substrate processing apparatus is capable of achieving a satisfactory airtight contact between the cover and the frame part, and between the fringe portion of the opening part and the cover.

Preferably, the opening part side seal member and the cover side seal member are shifted to inside and outside, respectively.

This eliminates the possibility of any contact between the tip of the opening part side seal member and the tip of the cover side seal member, so that the substrate processing apparatus can seal the interior of the processing bath more reliably.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view of a substrate processing apparatus according to a first preferred embodiment of the present invention taken on a plane vertical to substrates;

FIG. 2 is a longitudinal sectional view of the substrate processing apparatus taken on a plane parallel to the substrates;

FIG. 21 is a diagram illustrating the construction of a conventional substrate processing apparatus; and FIG. 22 is a diagram illustrating the construction of a conventional substrate processing apparatus provided with a processing chamber encasing a processing bath.

DESCRIPTION OF THE PREFERRED EMBODIMENTS

Figure 3:
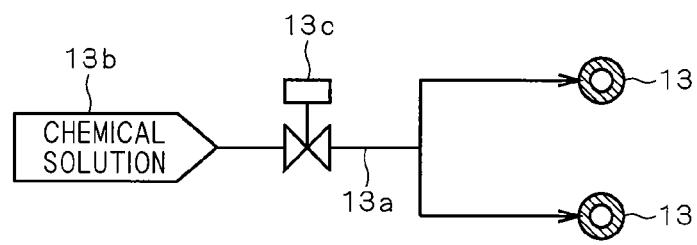
FIG. 3 is a diagram illustrating the construction of a chemical solution supplying system.

Preferred embodiments of the present invention will be described below with reference to the accompanying drawings.

1. First Preferred Embodiment

FIGS. 1 and 2 are diagrams illustrating the construction of a substrate processing apparatus 1 according to a first preferred embodiment of the present invention. Specifically, FIG. 1 is a longitudinal sectional view of the substrate processing apparatus 1 taken on a plane vertical to substrates. FIG. 2 is a longitudinal sectional view of the substrate processing apparatus 1 taken on a plane parallel to the substrates. In FIGS. 1 and 2, a rectangular coordinate system is added to clarify the positional relationship between parts.

The substrate processing apparatus 1 performs a chemical solution process and a washing process of a plurality of substrates (hereinafter referred to simply as "substrates") W, while holding the substrates W in their stand positions. As shown in FIGS. 1 and 2, the substrate processing apparatus 1 consists mainly of a processing bath 10 that stores a chemical solution, a chamber 20 that holds the processing bath 10, a transporting mechanism 30 that transports the substrates W up and down, and a casing 40 that forms an external wall of the apparatus 1.

The processing bath 10 is a container that stores a chemical solution as a processing solution. The processing bath 10 has an internal bath 11 that stores a chemical solution and is used to immerse the substrates W in the stored chemical solution, and an external bath 12 disposed around the internal bath 11. Disposed on the bottom of the internal bath 11 are chemical solution discharging parts 13 for discharging a chemical solution into the internal bath 11. The chemical solution is discharged from the chemical solution discharging parts 13, and stored in the internal bath 11, and then overflows the upper surface of the internal bath 11 to the external bath 12. Examples of the chemical solution are a mixed solution of ammonia water and hydrogen peroxide water, a mixed solution of hydrochloric acid and hydrogen peroxide water, and a mixed solution of sulfuric acid and hydrogen peroxide water.

FIG. 3 is a diagram illustrating a chemical solution supplying system connected to the chemical solution discharging parts 13. The chemical solution discharging parts 13 are connected via piping 13a for supplying the chemical solution to a chemical solution supply source 13b. An opening and closing valve 13c is interposed in a path of the piping 13a. Therefore, when the opening and closing valve 13c is opened, the chemical solution is supplied from the chemical solution supply source 13b via the piping 13a to the chemical solution discharging parts 13. The supplied chemical solution is then discharged from the chemical solution discharging parts 13 into the internal bath 11.

Returning to FIGS. 1 and 2, the chamber 20 is a processing chamber that holds on its inside the processing bath 10. The chamber 20 is formed by an airtight member, and has in its upper part an opening part 21 serving as a gate, through which the substrates W are loaded and unloaded. The upper surface of the chamber 20 is also provided with a cover 22 for opening and closing the opening part 21. As shown in FIG. 2, driving parts 24 are connected via connecting members 23 to the right and left of the cover 22, respectively. The driving parts 24 drive the cover 22 to move in a vertical direction (the Z-axis direction) and in a lengthwise direction (the Y-axis direction). Thus, the cover 22 is moved between a close position to close the opening part 21 (the position indicated by the solid line in FIG. 1) and a withdrawal position in front of the processing bath 10 (the position indicated by the chain line in FIG. 1).

Figure 4:
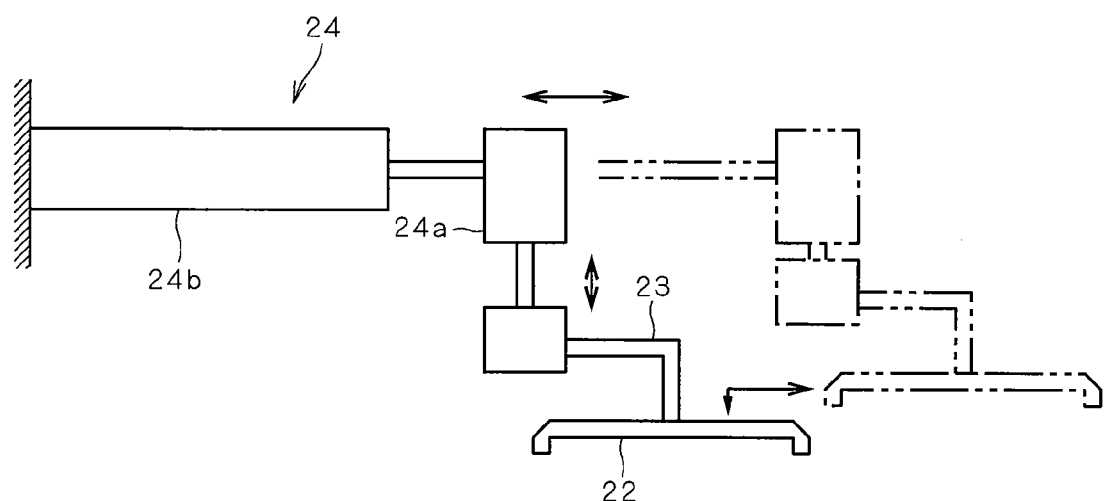
FIG. 4 is a diagram illustrating the construction of a driving part connected to a cover of a chamber.

FIG. 4 is a diagram illustrating the construction of the driving parts 24 connected to the cover 22. Each of the driving parts 24 has a first cylinder 24a that causes the connecting member 23 to move up and down, and a second cylinder 24b that causes the first cylinders 24a to move back and forth. When opening the cover 22, the driving parts 24 firstly drive the first cylinders 24a to contract so that the cover 22 is lifted above the chamber 20. Then, the driving parts 24 drive the second cylinders 24b to extend so that the cover 22 is moved to the frontal withdrawal position (the position indicated by the chain line). When closing the cover 22, the driving parts 24 firstly drive the second cylinders 24b to contract so that the cover 22 is moved to above the chamber 20. Then, the driving parts 24 drive the first cylinders 24a to extend so that the cover 22 is lowered to the close position (the position indicated by the solid line).

Returning to FIGS. 1 and 2, the transporting mechanism 30 is a mechanism for transporting the substrates W up and down. As shown in FIG. 1, the transporting mechanism 30 has a driving part 31, an arm part 32, a frame part 33, and a substrate holding part 34. The driving part 31 is disposed on the outside of the chamber 20, and drives the arm part 32, the frame part 33, and the substrate holding part 34 in integral up and down movements. The driving part 31 can be constructed by any one of various known mechanisms. For example, the driving part 31 may be a mechanism of moving up and down a rod fixed to a timing belt by rotating the timing belt by a motor.

When the cover 22 of the chamber 20 is opened, and the driving part 31 is operated, the arm part 32, the frame part 33, and the substrate holding part 34 are integrally moved up and down. Upon this, the substrates W held on the substrate holding part 34 are transported between an immersing position within the processing bath 10 (the position indicated by the solid line in FIGS. 1 and 2), and a lifted position (the position indicated by the chain line in FIGS. 1 and 2) above the chamber 20.

The frame part 33 is a rectangular frame disposed between the arm part 32 and the substrate holding part 34. The substrate holding part 34 is suspended and supported on the lower surface side of the frame part 33. When the substrates W are lowered to the immersing position, as shown in FIGS. 1 and 2, the frame part 33 is mounted on the opening part 21 of the chamber 20. A flange part 25 is formed around the opening part 21 of the chamber 20, and the upper surface of the flange part 25 is a flat surface having a predetermined width. Therefore, the upper surface of the flange part 25 and the lower surface of the frame part 33 contact with each other without leaving any space throughout the entire periphery of a fringe portion of the opening part 21. When the cover 22 is closed in this state, the cover 22 is mounted on the upper surface of the frame part 33. The lower surface of the fringe portion of the cover 22 is a flat surface opposed to the upper surface of the flange part 25. Hence, the lower surface of the cover 22 and the upper surface of the frame part 33 contact with each other without leaving any space throughout the entire periphery.

Figure 5:
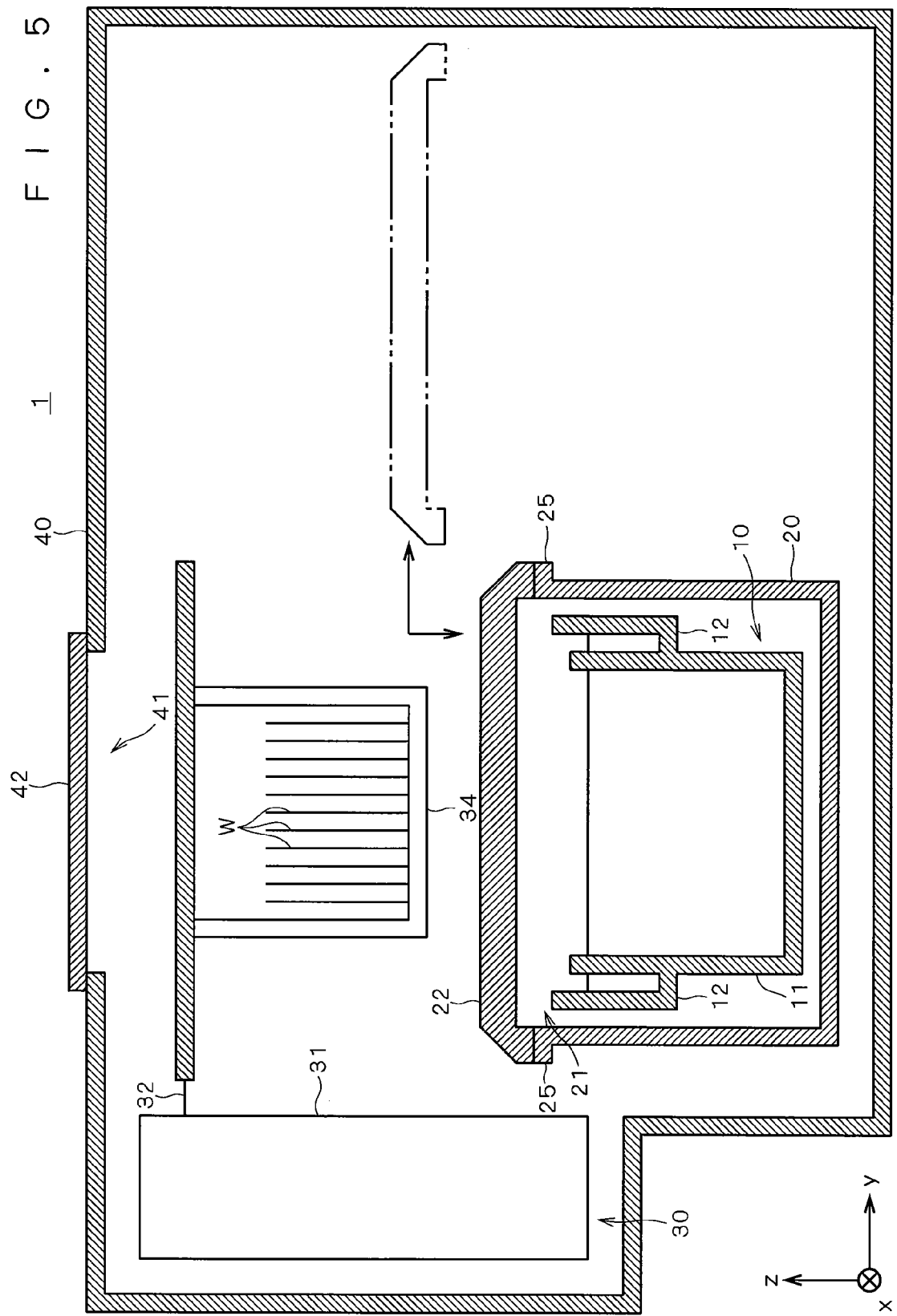
FIG. 5 is a longitudinal sectional view of the substrate processing apparatus taken on a plane vertical to the substrates.

FIG. 5 illustrates the substrate processing apparatus 1 when the substrates W are raised to the lifted position. When the substrates W are lifted, and the cover 22 is closed, the cover 22 is directly mounted on the flange part 25. The upper surface of the flange part 25 and the lower surface of the cover 22 contact with each other without leaving any space throughout the entire periphery of the fringe portion of the opening part 21.

Figure 6:
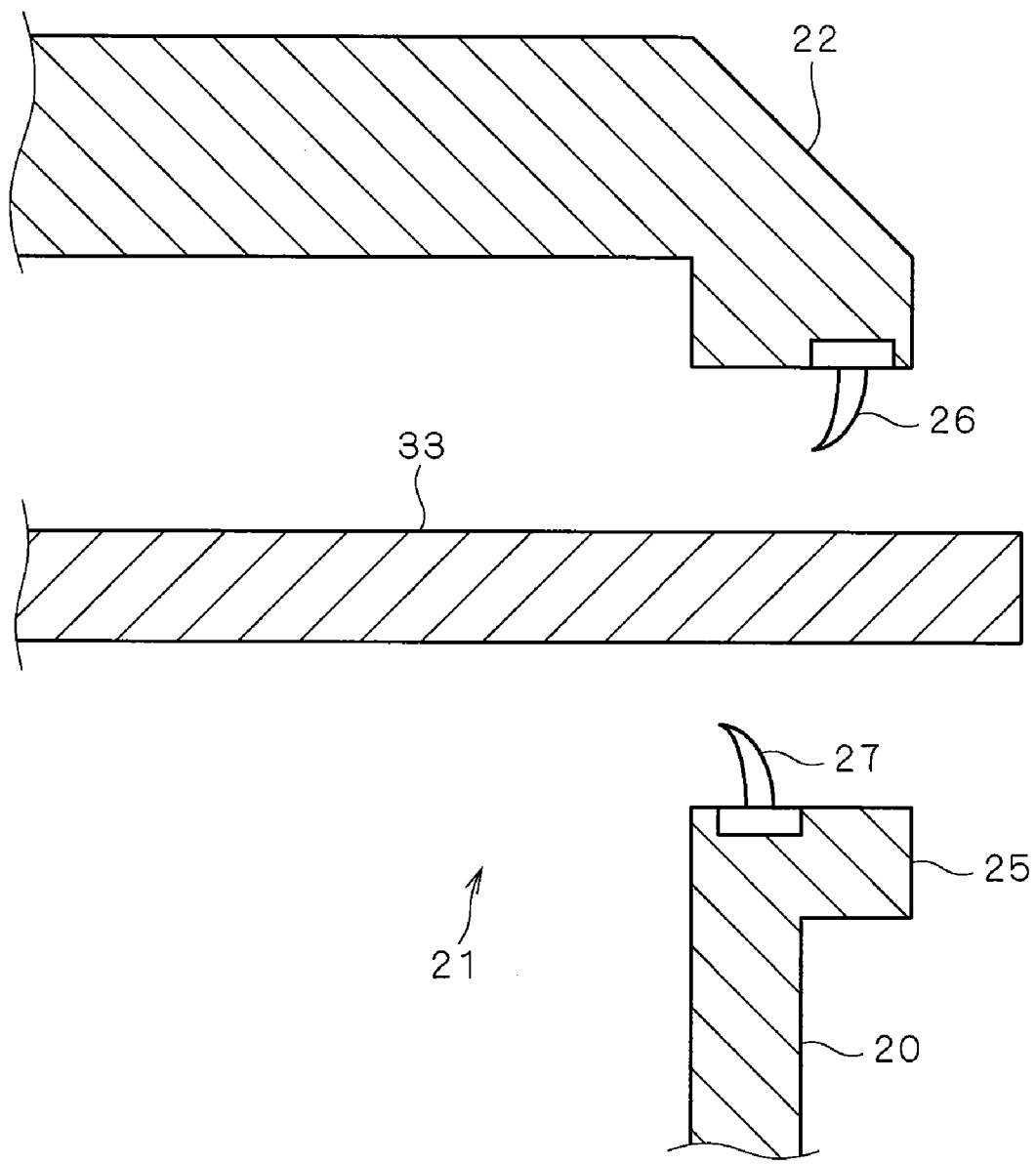
FIGS. 6 and 7 are enlarged longitudinal sectional views of the cover, a frame part, and a flange part.
Figure 7:
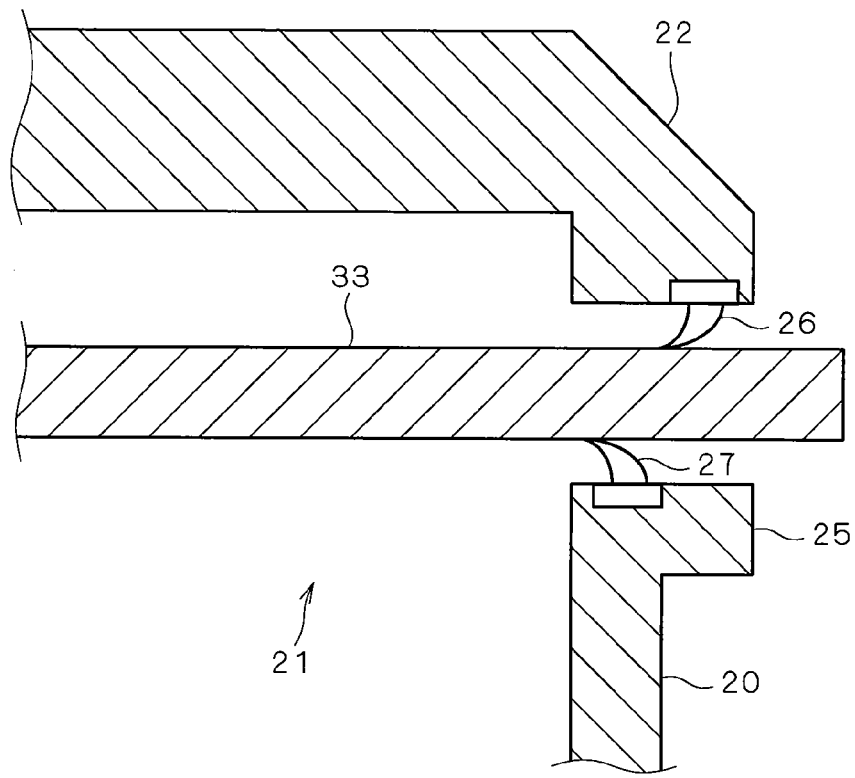
Figure 8:
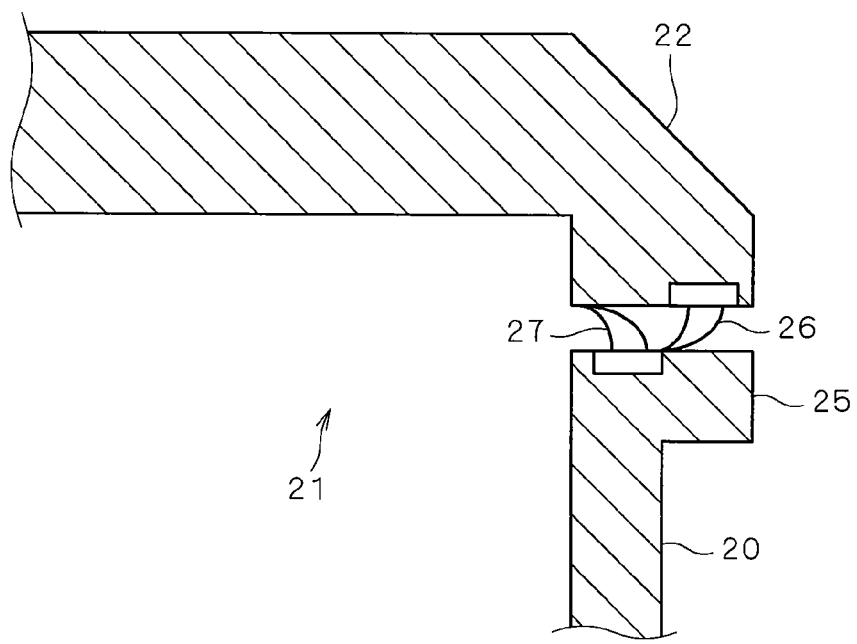
FIG. 8 is an enlarged longitudinal sectional view of the cover and the flange part.

FIGS. 6 and 7 are enlarged longitudinal sectional views of the cover 22, the frame part 33, and the flange part 25 in the fringe portion of the opening part 21. FIG. 8 is an enlarged longitudinal sectional view of the cover 22 and the flange part 25 in the fringe portion of the opening part 21. A cover side seal member 26 and an opening part side seal member 27 are provided on the lower surface of the cover 22 and the upper surface of the flange part 25, respectively. The cover side seal member 26 and the opening part side seal member 27 are formed by fluoroethylene resin, for example, and closely contact with contacted portions thereby to seal the contacted portions.

When the substrates W are lowered to the immersing position, and the cover 22 is closed with the frame part 33 interposed, as shown in FIG. 7, the cover side seal member 26 disposed on the cover 22 closely contacts with the upper surface of the frame part 33, thereby providing an airtight contact between the cover 22 and the frame part 33 throughout the entire periphery. Additionally, the opening part side seal member 27 disposed on the flange part 25 closely contacts with the lower surface of the frame part 33, thereby providing an airtight contact between the flange part 25 and the frame part 33 throughout the entire periphery. As a result, the interior of the chamber 20 is brought into the airtight state.

On the other hand, when the substrates W are raised to the lifted position, and the cover 22 is closed without interposing the frame part 33, as shown in FIG. 8, the cover side seal member 26 disposed on the cover 22 closely contacts with the upper surface of the flange part 25, and the opening part side seal member 27 disposed on the flange part 25 closely contacts with the lower surface of the cover 22, thereby providing an airtight contact between the cover 22 and the flange part 25 throughout the entire periphery. As a result, the interior of the chamber 20 is brought into the airtight state. The cover side seal member 26 and the opening part side seal member 27 are shifted to outside and inside, respectively. This eliminates the possibility of any contact between the tip of the cover side seal member 26 and the tip of the opening part side seal member 27.

Returning to FIGS. 1 and 2, the casing 40 is a case that forms the external wall of the substrate processing apparatus 1. The upper surface of the casing 40 is provided with a gate 41 for loading and unloading the substrates W, and a cover 42 for opening and closing the gate 41. The cover 42 is connected to the driving part 43. When the driving part 43 is operated, the cover 42 is moved to open or close the gate 41. The gate is closed when the substrates W are processed in the casing 40, and the gate 41 is opened when the substrates W are loaded or unloaded.

Solution seal parts 44 that provide communication through a solution (e.g. deionized water) between the inside and the outside of the casing 40 are formed at part of the right and left wall surfaces (a plus x side and a minus x side) of the casing 40, respectively. The solutions in the solution seal parts 44 are stored at trough-like sump portions formed at the upper ends of lower wall surfaces of the solution seal parts 44. The lower ends of upper wall surfaces of the solution seal parts 44 are immersed in the solutions stored in the sump portions. The above-mentioned connecting members 23 pass through the solutions in the solution seal parts 44, and connect the cover 22 and the driving part 24. Consequently, the driving parts 24 can be disposed on the outside of the casing 40, and the internal atmosphere of the casing 40 can be separated from the external atmosphere. This eliminates the possibility of corrosion of the cylinders constituting the driving parts 24 due to the internal atmosphere of the casing 40.

The upper space within the casing 40 is used as a washing process area for subjecting the substrates W to the washing process. The washing process area is provided with deionized water discharging parts 45. The deionized water discharging parts 45 have a pair of deionized water supplying pipes extending in the lengthwise direction (the Y-axis direction), each of which is provided with a plurality of deionized water discharging holes (not shown). The deionized water discharging holes are directed to the substrates W in the lifted position. The deionized water discharging parts 45 discharge deionized water in the shape of shower from the deionized water discharging holes to the substrates W in the lifted position. This accomplishes the washing process of the substrates W.

Figure 9:
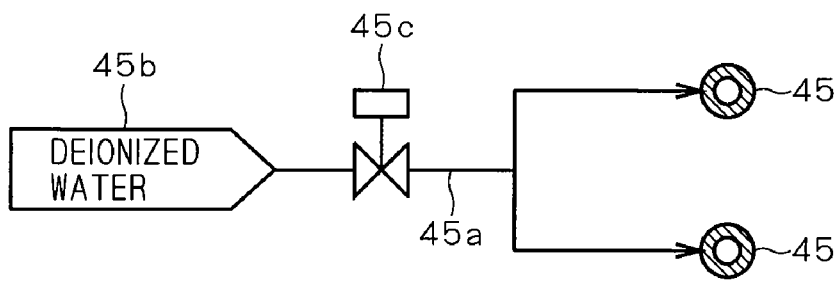
FIG. 9 is a diagram illustrating the construction of a deionized water supplying system.

FIG. 9 is a diagram illustrating the construction of a deionized water supplying system connected to the deionized water discharging parts 45. The deionized water discharging parts 45 are connected, via piping 45a for supplying deionized water, to a deionized water supply source 45b. An opening and closing valve 45c is interposed in a path of the piping 45a. Therefore, when the opening and closing valve 45c is opened, the deionized water is supplied from the deionized water supply source 45b via the piping 45a to the deionized water discharging parts 45. The supplied deionized water is then discharged from the deionized water discharging holes of the deionized water discharging parts 45.

Figure 10:
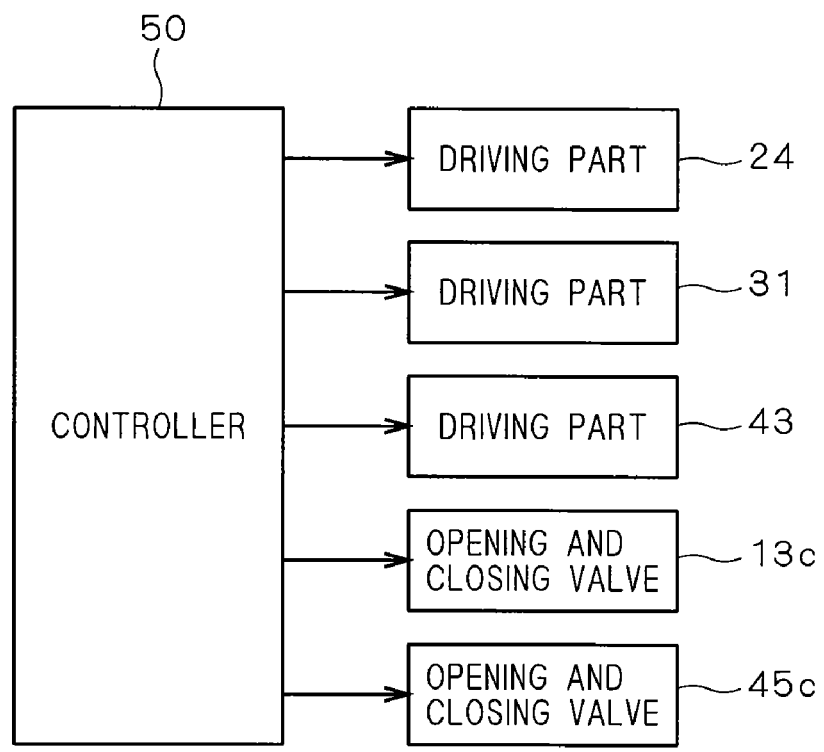
FIG. 10 is a block diagram illustrating the configuration of a control system.
Figure 11:
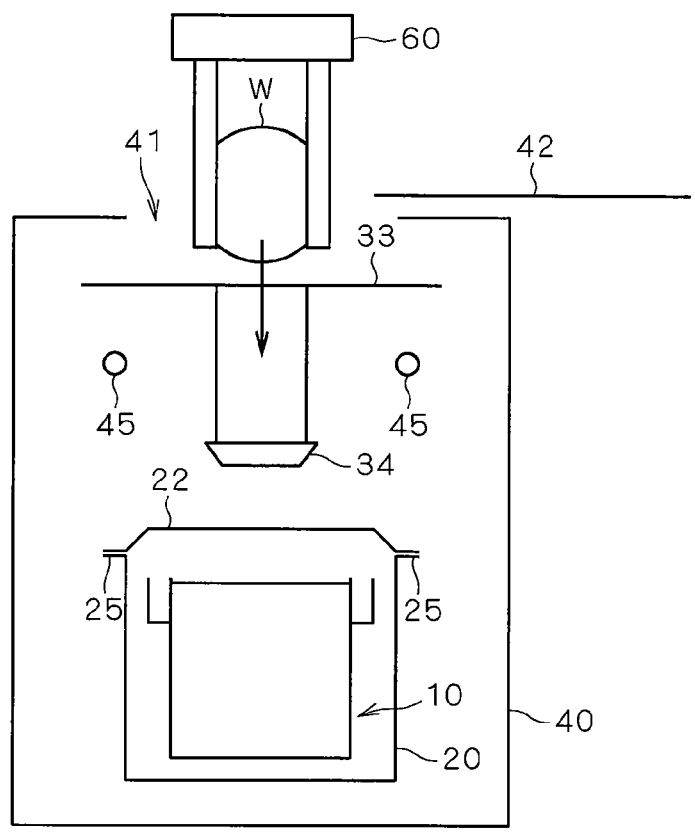
FIGS. 11 to 17 are diagrams illustrating the states of operations of the substrate processing apparatus.
Figure 12:
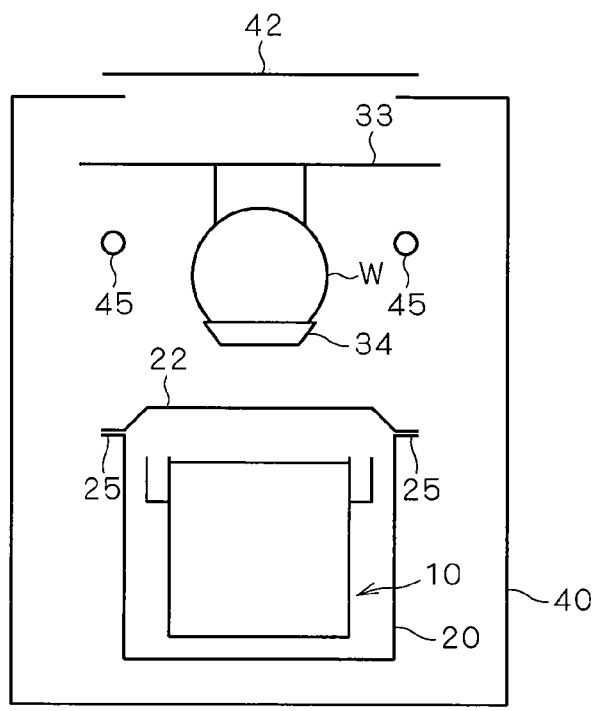

The substrate processing apparatus 1 is further provided with a controller 50 for controlling the operations of the above-mentioned respective parts. FIG. 10 is a block diagram illustrating the configuration of a control system including the controller 50. The controller 50 is electrically connected to the driving parts 24, 31, 43, and the opening and closing valves 13c, 45c. The controller 50 applies a predetermined electrical signal to each of these parts to control their respective operations.

The operation of the substrate processing apparatus 1 having the above-mentioned construction will be described below. FIGS. 11 to 17 are diagrams illustrating the states of operations at respective stages in the substrate processing apparatus 1. The driving parts 24, 31, 43, and the opening and closing valves 13c, 45c are controlled to progress these operations by the controller 50.

First, the substrate processing apparatus 1 opens the cover 42 of the casing 40. An external transport robot 60 loads the substrates W through the gate 41 into the casing 40 (the state in FIG. 11). The substrate holding part 34 waiting at an upper position within the casing 40 receives the loaded substrates W from the transport robot 60. After the transport robot 60 mounts the substrates W on the substrate holding part 34, it is withdrawn to above the casing 40. The substrate processing apparatus 1 then closes the cover 42 (the state in FIG. 12).

Figure 13:
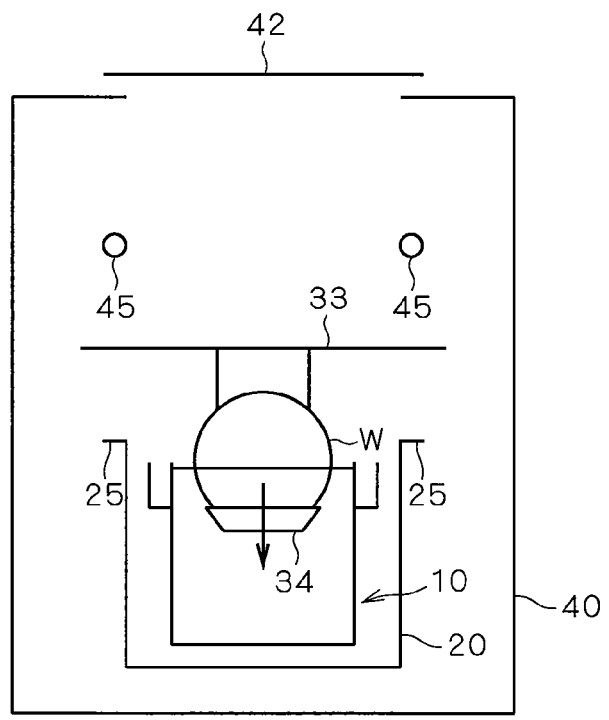
Figure 14:
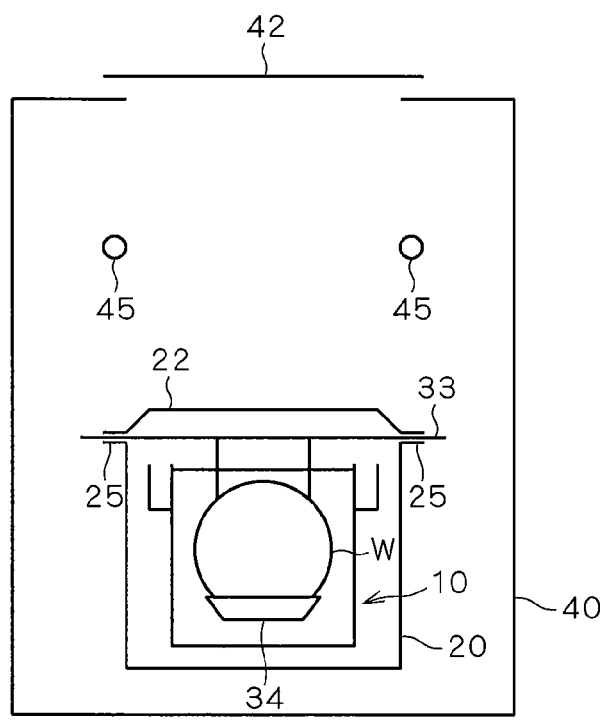

Subsequently, the substrate processing apparatus 1 opens the cover 22 of the chamber 20, and lowers the frame part 33 and the substrate holding part 34 of the transporting mechanism 30 (the state in FIG. 13). Thus, the substrates W can be loaded into the chamber 20, and then immersed in the chemical solution stored in the processing bath 10. When the frame part 33 is mounted on the flange part 25 of the chamber 20, the descent of the substrates W is completed. Thereafter, the substrate processing apparatus 1 closes the cover 22 of the chamber 20. The cover 22 is mounted on the frame part 33, and the interior of the chamber 20 is sealed with the frame part 33 interposed between the flange part 25 and the cover 22 (the state in FIG. 14).

Figure 15:
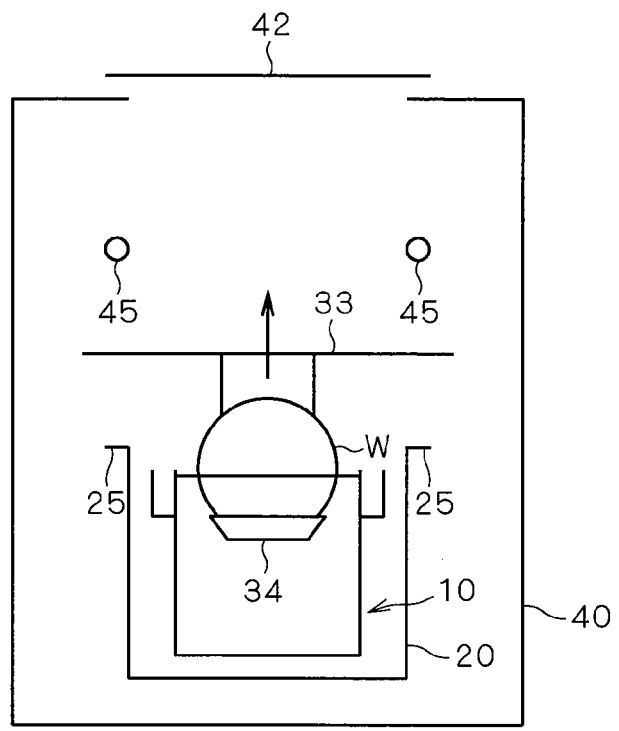

Upon completion of the immersion process for a predetermined time, the substrate processing apparatus 1 reopens the cover 22 of the chamber 20, and raises the frame part 33 and the substrate holding part 34 of the transporting mechanism 30 (the state in FIG. 15). Thus, the substrates W can be raised from the chemical solution in the processing bath 10, and then raised to the lifted position above the chamber 20. After the substrates W are lifted, the substrate processing apparatus 1 closes the cover 22 of the chamber 20. The cover 22 is brought into a direct contact with the flange part 25 of the chamber 20, thereby sealing the interior of the chamber 20.

Figure 16:
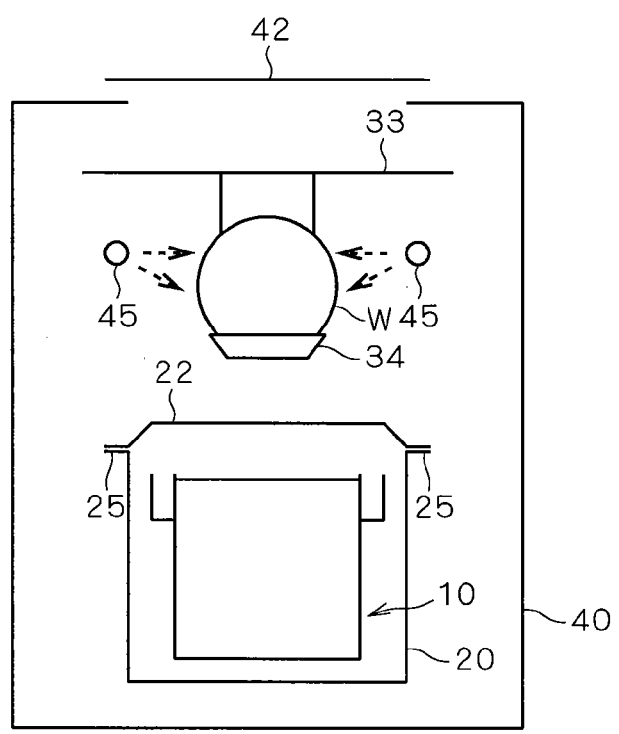
Figure 17:
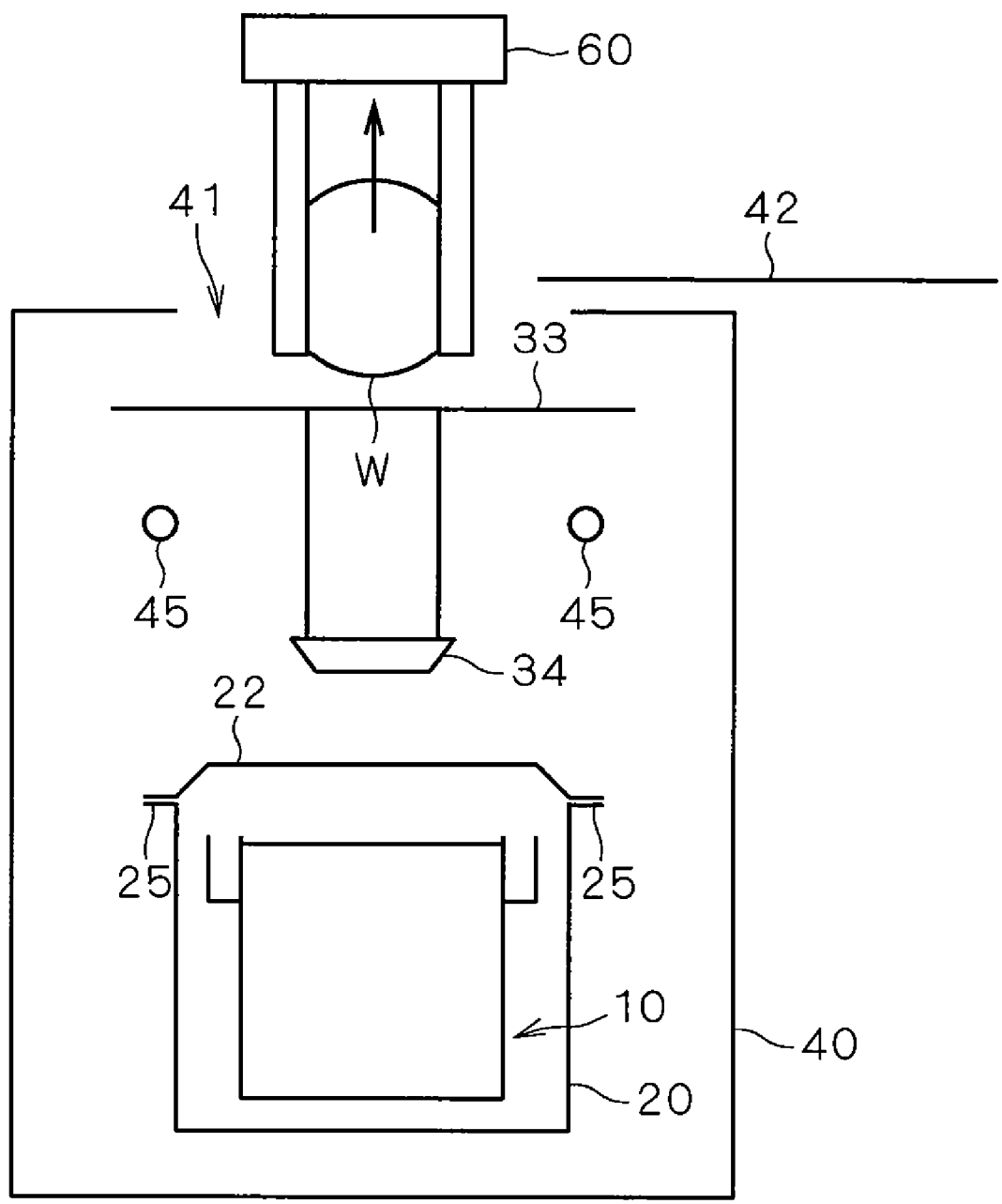

The substrate processing apparatus 1 performs a washing process of the substrates W raised to the lifted position by discharging deionized water from the deionized water discharging parts 45 (the state in FIG. 16). This washes out the chemical solution attached to the surfaces of the substrates W. Water droplets falling from the substrates W drop on the cover 22 of the chamber 20, and then are drained into a drainage part (not shown) disposed below the casing 40. Sealing of the chamber 20 avoids that the deionized water enter into the chamber 20.

On termination of the washing process, the substrate processing apparatus 1 opens the cover 42 of the casing 40. Thereafter, the external transport robot 60 enters into the casing 40. The transport robot 60 receives the substrates W held on the substrate holding part 34, and unloads them to above the casing 40 (the state in FIG. 17). This completes the process of the substrates W in the substrate processing apparatus 1.

As described above, the substrate processing apparatus 1 of the first preferred embodiment has the frame part 33 above the substrate holding part 34. When the substrates W are loaded into the chamber 20, the opening part 21 is closed with the frame part 33 interposed between the chamber 20 and the cover 22, thereby sealing the interior of the chamber 20. When the substrates W are unloaded to above the chamber 20, the opening part 21 is closed by a direct contact between the chamber 20 and the cover 22, thereby sealing the interior of the chamber 20. Hence, the interior of the chamber 20 can be sealed satisfactorily when the substrates W are loaded into the chamber 20, and when the substrates W are unloaded above the chamber 20.

2. Second Preferred Embodiment

Figure 18:
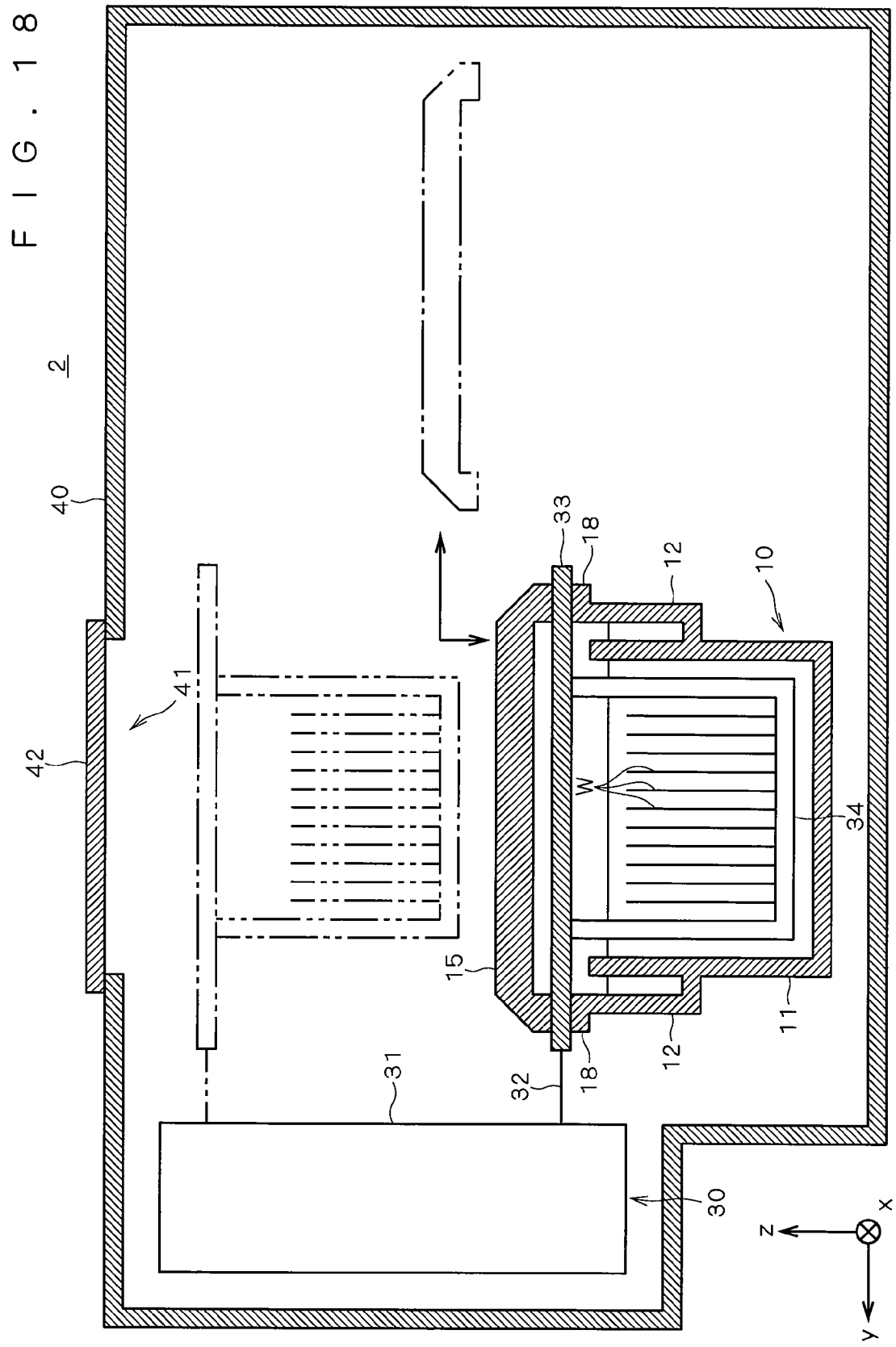
FIG. 18 is a longitudinal sectional view of a substrate processing apparatus according to a second preferred embodiment taken on a plane vertical to substrates.
Figure 19:
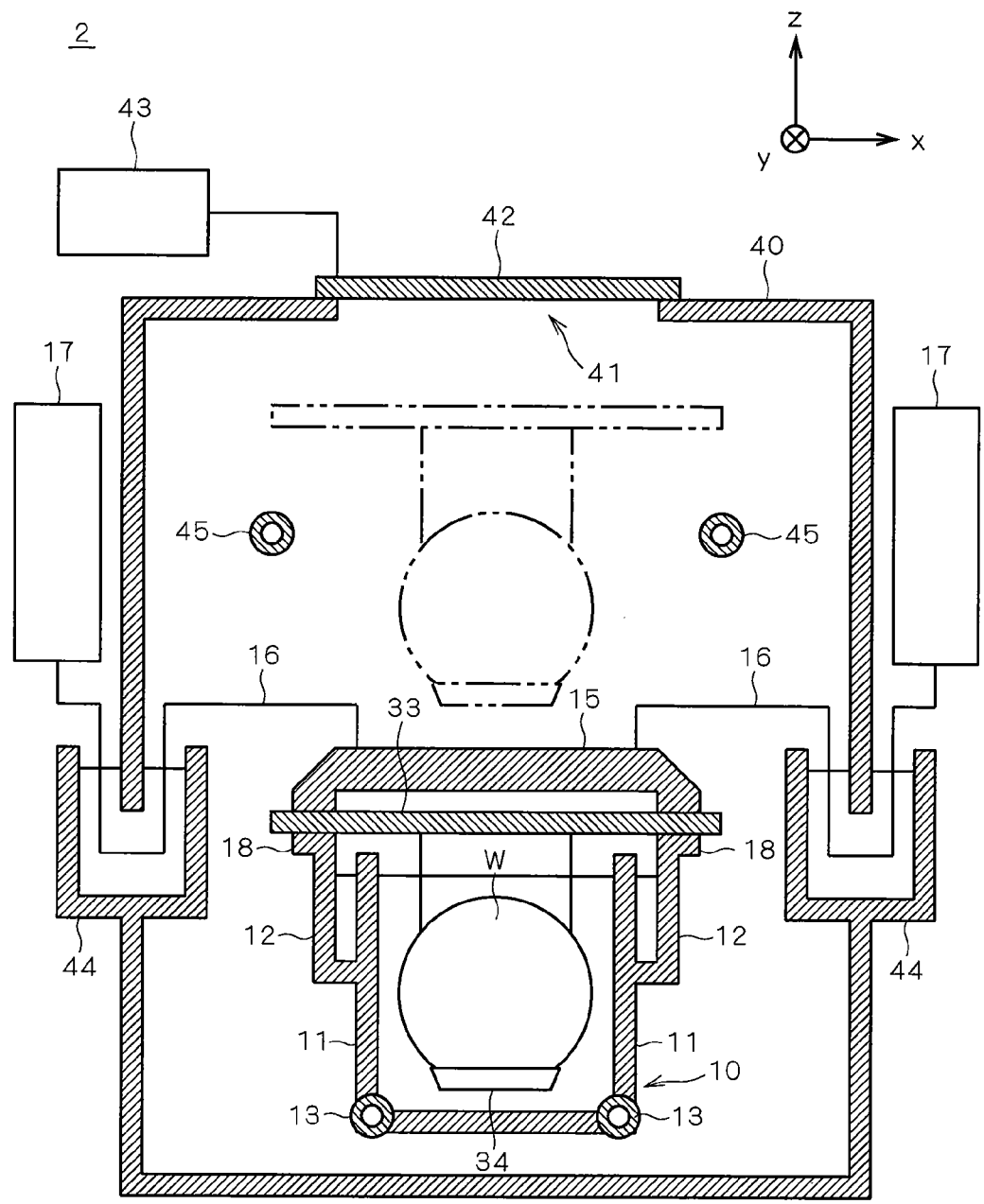
FIG. 19 is a longitudinal sectional view of the substrate processing apparatus of the second preferred embodiment taken on a plane parallel to the substrates.

A second preferred embodiment of the present invention will next be described. FIGS. 18 and 19 are diagrams illustrating the construction of a substrate processing apparatus 2 of the second preferred embodiment. The substrate processing apparatus 2 differs from the substrate processing apparatus 1 in the absence of the chamber 20 and the constructions of a processing bath 10 and a cover 15. Otherwise, the construction is identical to that described with respect to the substrate processing apparatus 1. Therefore, in FIGS. 18 and 19, the same reference numerals have been used as in FIGS. 1 and 2. The overlapping descriptions are left out of the following.

The substrate processing apparatus 2 has the cover 15 for opening and closing the processing bath 10. Driving parts 17 are connected via connecting members 16 to the right and left of the cover 15, respectively. The connecting members 16 and the driving parts 17, which have the same construction as the connecting member 23 and the driving parts 24 in the first preferred embodiment, respectively, cause the cover 15 to move in a vertical direction (the Z-axis direction) and in a lengthwise direction (the Y-axis direction). Thus, the cover 15 is moved between a close position to close the processing bath 10 (the position indicated by the solid line in FIG. 18) and a withdrawal position in front of the processing bath 10 (the position indicated by the chain line in FIG. 18).

A flange part 18 is formed at a peripheral edge portion of an external bath 12 of the processing bath 10. A frame part 33 is mounted on the flange part 18 when substrates W are lowered to an immersing position within the processing bath 10 by the operation of a transporting mechanism 30. Like the flange part 25 of the first preferred embodiment, the upper surface of the flange part 18 is a flat surface having a predetermined width. Therefore, the upper surface of the flange part 18 and the lower surface of the frame part 33 contact with each other without leaving any space throughout the entire periphery of a fringe portion of the external bath 12. When the cover 15 is closed in this state, the cover 15 is mounted on the upper surface of the frame part 33. The lower surface of the cover 15 is a flat surface opposed to the upper surface of the flange part 18. Hence, the lower surface of the cover 15 and the upper surface of the frame part 33 contact with each other without leaving any space throughout the entire periphery.

Figure 20:
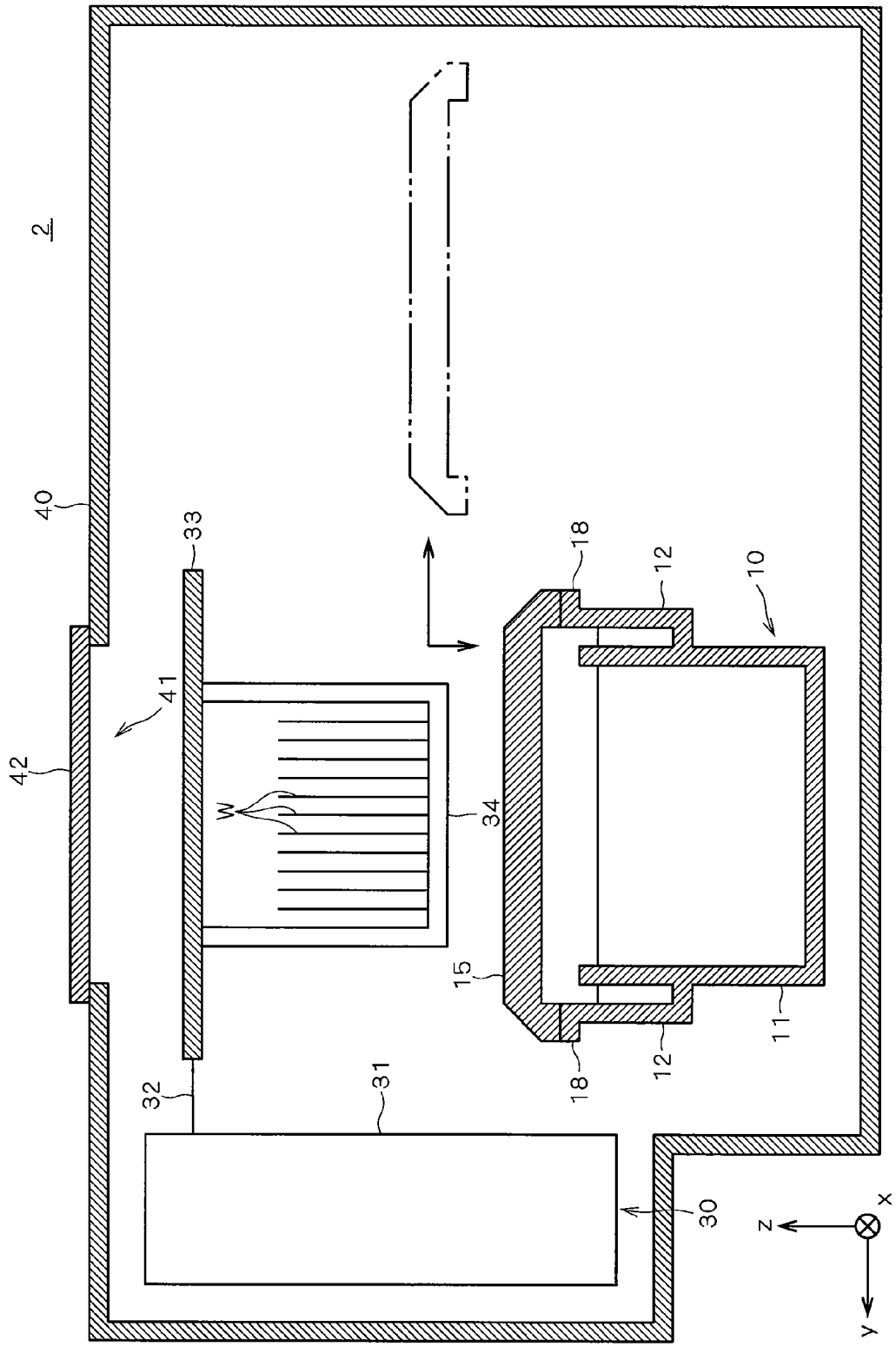
FIG. 20 is a longitudinal sectional view of the substrate processing apparatus of the second preferred embodiment taken on a plane vertical to the substrates.

FIG. 20 illustrates the substrate processing apparatus 2 when the substrates W are raised to a lifted position. When the substrates W are raised, and the cover 15 is closed, the cover 15 is directly mounted on the flange part 18. The upper surface of the flange part 18 and the lower surface of the cover 15 contact with each other without leaving any cleaning throughout the entire periphery of the fringe portion of the external bath 12.

Like the cover 22 of the first preferred embodiment, a cover side seal member is provided on the lower surface of the cover 15. Like the flange part 25 of the first preferred embodiment, an opening part side seal member 27 is provided on the upper surface of the flange part 18. When the substrates W are lowered to the immersing position, and the cover 15 is closed with the frame part 33 interposed, the cover side seal member provides an airtight contact between the cover 15 and the frame part 33, and the opening part side seal member provides an airtight contact between the flange part 18 and the frame part 33. As a result, the interior of the processing bath 10 is brought into the airtight state.

Specifically, when the substrates W are loaded into the processing bath 10, the substrate processing apparatus 2 of the second preferred embodiment seals the interior of the processing bath 10 by closing the upper part of the processing bath 10, with the frame part 33 interposed between the flange part 18 and the cover 15. When the substrates W are unloaded to above the processing bath 10, the substrate processing apparatus 2 seals the interior of the processing bath 10 by closing the upper part of the processing bath 10 with a direct contact between the frame part 18 and the cover 15. Hence, the interior of the processing bath 10 can be sealed satisfactorily when the substrates W are loaded into the processing bath 10, and when the substrates W are unloaded to above the processing bath 10. Additionally, the substrate processing apparatus 2 seals the processing bath 10 itself, enabling the processing space to be sealed in a narrower range.

The substrate processing apparatus 2 is further provided with a controller similar to the controller 50 of the first preferred embodiment. The controller 50 controls the operations of driving parts 17, 31, 43, and opening and closing valves 13c, 45c. Thus, the substrate processing apparatus 2 performs a chemical solution process and a washing process with respect to the substrates W, in the same manner as in the substrate processing apparatus 1 of the first preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus that performs a predetermined process of a substrate, comprising:
   a) a processing chamber having on an inside thereof a processing space for performing a predetermined process of a substrate;
   b) a transporting part that transports a substrate between the inside of said processing chamber and an outside thereof, through an opening part formed at an upper part of said processing chamber, said transporting part comprising:
   b-1) a driving part disposed on the outside of said processing chamber;
   b-2) a holding part that holds a substrate and moves between the inside and the outside of said processing chamber by driving of said driving part; and
   b-3) a frame part disposed between said driving part and said holding part, and
   c) a cover that opens and closes said opening part,
   wherein, when said holding part is moved to the inside of said processing chamber, and said cover is closed, said frame part is interposed between a fringe portion of said opening part and said cover, thereby sealing an interior of said processing chamber, and
   when said holding part is moved to the outside of said processing chamber, and said cover is closed, said cover contacts with said fringe portion of said opening part, thereby sealing the interior of said processing chamber.

2. The substrate processing apparatus according to claim 1 wherein,
   said fringe portion of said opening part is provided with an opening part side seal member,
   when said holding part is moved to the inside of said processing chamber, and said cover is closed, said opening part side seal member provides an airtight contact between said fringe portion of said opening part and said frame part, and
   when said holding part is moved to the outside of said processing chamber, and said cover is closed, said opening part side seal member provides an airtight contact between said fringe portion of said opening part and said cover.

3. The substrate processing apparatus according to claim 2 wherein,
   a cover side seal member is disposed at a lower part of said cover, when said holding part is moved to the inside of said processing chamber, and said cover is closed, said cover side seal member provides an airtight contact between said cover and said frame part, and when said holding part is moved to the outside of said processing chamber, and said cover is closed, said cover side seal member provides an airtight contact between said fringe portion of said opening part and said cover.

4. The substrate processing apparatus according to claim 3 wherein, said opening part side seal member provided on said opening part is located more inward than the location of said cover side seal member disposed at a lower part of said cover.

5. The substrate processing apparatus according to claim 4 wherein, a processing bath that stores a processing solution is disposed on the inside of said processing chamber, and a substrate held by said holding part is immersed in said processing solution stored in said processing bath.

6. A substrate processing apparatus that performs a predetermined process of a substrate comprising:

a) a processing bath that stores a processing solution;

b) a transporting part that transports a substrate between an inside and an outside of said processing bath, through an opening part formed at an upper part of said processing bath, said transporting part comprising:

b-1) a driving part disposed on the outside of said processing bath;

b-2) a holding part that holds a substrate and moves between the inside and the outside of said processing bath by driving of said driving part; and b-3) a frame part disposed between said driving part and said holding part, and c) a cover that opens and closes said opening part, wherein, when said holding part is moved to the inside of said processing bath, and said cover is closed, said frame part is interposed between a fringe portion of said opening part and said cover, thereby sealing an interior of said processing bath, and when said holding part is moved to the outside of said processing bath, and said cover is closed, said cover contacts with said fringe portion of said opening part, thereby sealing the interior of said processing bath.

7. The substrate processing apparatus according to claim 6 wherein, said fringe portion of said opening part is provided with an opening part side seal member, when said holding part is moved to the inside of said processing bath, and said cover is closed, said opening part side seal member provides an airtight contact between said fringe portion of said opening part and said frame part, and when said holding part is moved to the outside of said processing bath, and said cover is closed, said opening part side seal member provides an airtight contact between said fringe portion of said opening part and said cover.

8. The substrate processing apparatus according to claim 7 wherein, a cover side seal member is disposed at a lower part of said cover, when said holding part is moved to the inside of said processing bath, and said cover is closed, said cover side seal member provides an airtight contact between said cover and said frame part, and when said holding part is moved to the outside of said processing bath, and said cover is closed, said cover side seal member provides an airtight contact between said fringe portion of said opening part and said cover.

9. The substrate processing apparatus according to claim 8 wherein, said opening part side seal member provided on said opening part is located more inward than the location of said cover side seal disposed at a lower part of said cover.

* * * * *

UNITED STATES PATENT AND TRADEMARK OFFICE
CERTIFICATE OF CORRECTION

| | | |
|---|---|---|
| PATENT NO. | : 7,615,118 B2 | Page 1 of 1 |
| APPLICATION NO. | : 11/464658 | |
| DATED | : November 10, 2009 | |
| INVENTOR(S) | : Fukui et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 444 days.

Signed and Sealed this

Nineteenth Day of October, 2010

David J. Kappos
*Director of the United States Patent and Trademark Office*